United States Patent
Audibert et al.

(10) Patent No.: US 9,461,446 B1
(45) Date of Patent: Oct. 4, 2016

(54) ELECTRICAL ENCLOSURE HAVING A BREAKER COVER GASKET AND METHOD

(71) Applicant: General Electric Company, Schenectady, NY (US)

(72) Inventors: Kevin Joseph Audibert, Morris, CT (US); Michael Paul Lafond, Wallingford, CT (US); Ganesh Venkataraman, Rocky Hill, CT (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 24 days.

(21) Appl. No.: 14/672,978

(22) Filed: Mar. 30, 2015

(51) Int. Cl.
*H02B 13/025* (2006.01)
*H02B 1/28* (2006.01)
*H02B 1/38* (2006.01)
*H05K 5/06* (2006.01)
*H05K 5/02* (2006.01)

(52) U.S. Cl.
CPC .............. *H02B 13/025* (2013.01); *H02B 1/28* (2013.01); *H02B 1/38* (2013.01); *H05K 5/0217* (2013.01); *H05K 5/061* (2013.01)

(58) Field of Classification Search
CPC .......... H02B 1/066; H02B 1/28; H02B 1/38; H02B 1/44; H02B 13/025; H02B 13/045; H01H 2009/343
See application file for complete search history.

(56) References Cited

U.S. PATENT DOCUMENTS

| | | |
|---|---|---|
| 2,770,701 A | 11/1956 | Yarrick |
| 4,158,757 A | 6/1979 | Reichert et al. |
| 5,493,474 A | 2/1996 | Schkrohowsky et al. |
| 5,574,624 A | 11/1996 | Rennie et al. |
| 5,689,097 A | 11/1997 | Aufermann et al. |
| 5,710,402 A | 1/1998 | Karnbach et al. |
| 5,934,115 A | 8/1999 | Bernier et al. |
| 6,388,867 B1 | 5/2002 | Rakus et al. |
| 7,054,143 B2 | 5/2006 | Eiselt et al. |
| 7,558,052 B1 | 7/2009 | Coomer et al. |
| 7,586,738 B1 | 9/2009 | Hartzel et al. |

(Continued)

FOREIGN PATENT DOCUMENTS

| | | | |
|---|---|---|---|
| EP | 0387973 A1 | 9/1990 | |
| EP | 0478432 A1 | 4/1992 | |
| EP | 2521229 A1 * | 11/2012 | ............... H02B 1/28 |

OTHER PUBLICATIONS

Eaton, "Door escutcheon with gasket for Magnum low voltage circuit breakers", Instructional Leaflet IL2C12999H01, Jan. 2010, pp. 1-2.

*Primary Examiner* — Robert J Hoffberg
(74) *Attorney, Agent, or Firm* — GE Global Patent Operation; Stephen G. Midgley (57) ABSTRACT

An electrical enclosure includes at least one circuit breaker compartment and a cover mounted thereon. The cover includes an opening receptive of at least one circuit breaker. A gasket extends about at least a portion of the opening. The gasket includes an inner seal assembly and an outer seal assembly. The outer seal assembly is positioned to engage the at least one circuit breaker when the cover is in a closed position. The inner seal assembly is movable between a non-deployed configuration spaced from the at least one circuit breaker and a deployed configuration engaged with the at least one circuit breaker. The inner seal assembly is responsive to a pressure wave in the at least one circuit breaker compartment to move from the non-deployed configuration to the deployed configuration and substantially prevent out gassing through the opening in the cover.

20 Claims, 5 Drawing Sheets

(56) References Cited

U.S. PATENT DOCUMENTS

| | | |
|---|---|---|
| 7,732,727 B2 | 6/2010 | Saxl et al. |
| 7,821,774 B2 | 10/2010 | Josten et al. |
| 7,871,137 B2 | 1/2011 | Schulz et al. |
| 7,952,042 B2 * | 5/2011 | Coomer ............... H02B 11/02 200/293 |
| 7,952,857 B1 | 5/2011 | Motley et al. |
| 8,101,881 B2 | 1/2012 | Miller et al. |
| 9,318,883 B2 * | 4/2016 | Schmidt ............... H02B 13/025 |
| 2012/0028559 A1 | 2/2012 | Kingston |
| 2015/0036310 A1 | 2/2015 | Karandikar et al. |
| 2016/0118200 A1 * | 4/2016 | Devine ............... H01H 9/0207 200/295 |

* cited by examiner

ELECTRICAL ENCLOSURE HAVING A BREAKER COVER GASKET AND METHOD

BACKGROUND OF THE INVENTION

The subject matter disclosed herein relates to the art of electrical enclosures and, more particularly, to an electrical enclosure having a breaker cover gasket.

Electrical enclosures house a variety of electrical components including circuit breakers, bus bars, control equipment, and the like. Typically, an electrical enclosure includes a cable portion that houses bus bars and the like, and a load portion. The load portion may take the form of one or more circuit breaker compartments that may house circuit breakers, and one or more auxiliary compartments that may house control components and the like. In addition to being exposed to over current conditions, many circuit breakers may also be exposed to an arc fault. During an arc fault event, gases are often generated either in the cable portion, the load portion, or circuit breaker compartments. It is desirable to guide the gases from the electrical enclosure along a selected pathway.

BRIEF DESCRIPTION OF THE INVENTION

According to one aspect of an exemplary embodiment, an electrical enclosure includes at least one circuit breaker compartment and a cover mounted to the electrical enclosure. The cover includes an opening receptive of the at least one circuit breaker. A gasket extends about at least a portion of the opening. The gasket includes an inner seal assembly and an outer seal assembly. The outer seal assembly is positioned to engage the at least one circuit breaker when the cover is in a closed position with respect to the at least one circuit breaker, and the inner seal assembly is movable between a non-deployed configuration and a deployed configuration. The inner seal assembly in the non-deployed configuration is spaced from the at least one circuit breaker in the closed position of the cover. The inner seal assembly is responsive to a pressure wave in the at least one circuit breaker compartment to move from the non-deployed configuration to the deployed configuration to engage the at least one circuit breaker and substantially prevent out gassing through the opening in the cover.

According to another aspect of an exemplary embodiment, an electrical enclosure includes at least one circuit breaker compartment, at least one circuit breaker having an outer surface positioned in the at least one circuit breaker compartment, and a cover mounted to the electrical enclosure. The cover includes an opening receptive of the at least one circuit breaker. A gasket extends about at least a portion of the opening. The gasket includes an inner seal assembly and an outer seal assembly. The outer seal assembly is positioned to engage the at least one circuit breaker when the cover is in a closed position. The inner seal assembly is movable between a non-deployed configuration and a deployed configuration. The inner seal assembly in the non-deployed configuration is spaced from the at least one circuit breaker in the closed position of the cover. The inner seal assembly is responsive to a pressure wave in the at least one circuit breaker compartment to move from the non-deployed configuration to the deployed configuration to engage the outer surface of the at least one circuit breaker and substantially prevent out gassing through the cover.

According to yet another aspect of an exemplary embodiment, a method of sealing an electrical enclosure includes positioning a cover to cover a circuit breaker compartment of the electrical enclosure, passing a portion of a circuit breaker arranged in the circuit breaker compartment through an opening formed in the cover, sealing about an outer surface of the circuit breaker with an outer seal assembly extending about the opening, and selectively sealing about the outer surface of the circuit breaker with an inner seal assembly responsive to a pressure wave in the circuit breaker compartment. The inner seal assembly is spaced from the circuit breaker in absence of a pressure wave.

These and other advantages and features will become more apparent from the following description taken in conjunction with the drawings.

BRIEF DESCRIPTION OF DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
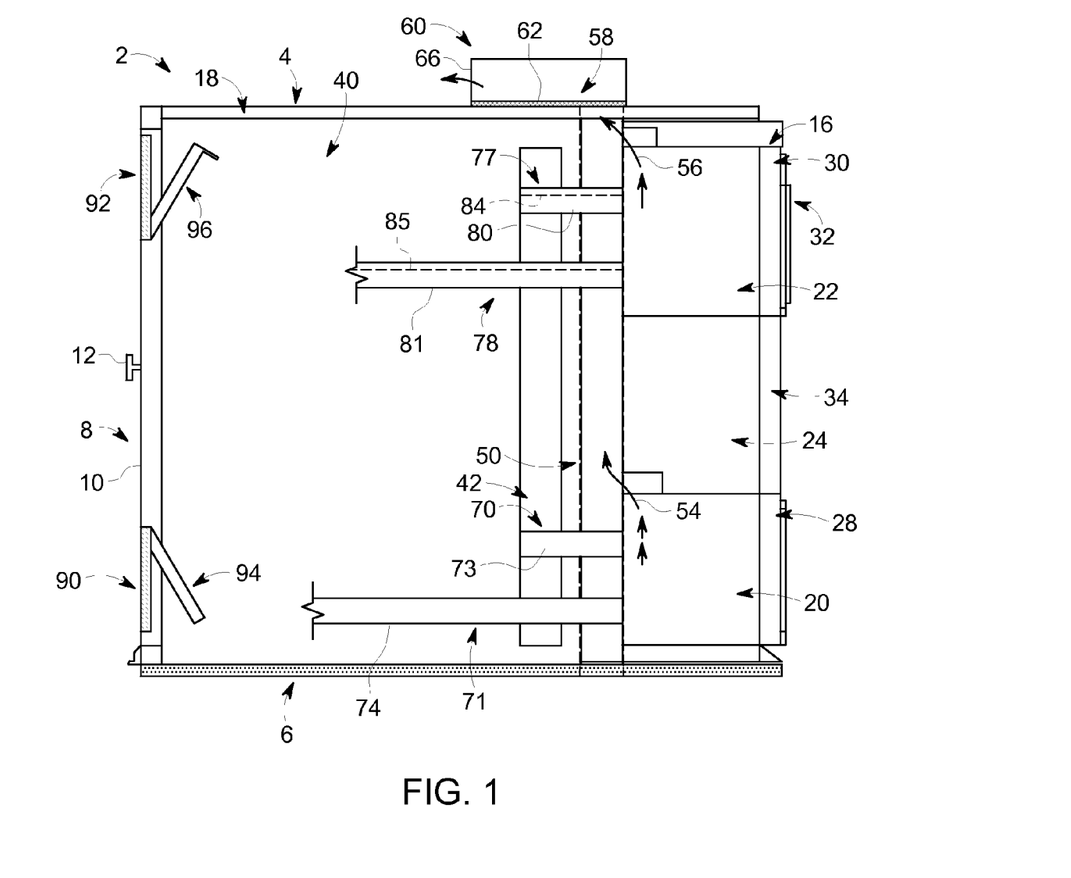
FIG. 1 depicts an electrical enclosure including a circuit breaker portion, a cable portion, and a cover provided with a gasket, in accordance with an exemplary embodiment.

An electrical enclosure, in accordance with an exemplary embodiment, is illustrated generally at 2, in FIG. 1. Electrical enclosure 2 includes a plurality of walls including a first wall 4, a second wall 6, and a third wall 8. In the exemplary embodiment shown, first wall 4 defines a top wall, second wall 6 defines a bottom wall, and third wall 8 defines a rear wall. Rear wall 8 may take the form of a cover 10 having a handle or knob 12. At this point, it should be understood that electrical enclosure 2 may also include side walls (not shown). Electrical enclosure 2 includes a circuit breaker portion 16 and a cable portion 18 defined, at least in part, by one or more of the top wall 4, bottom wall 6, rear wall 8, and side walls.

Circuit breaker portion 16 includes a first circuit breaker compartment 20 and a second circuit breaker compartment 22. Second circuit breaker compartment 22 is arranged between first circuit breaker compartment 20 and top wall 4. An auxiliary compartment 24 is arranged between first and second circuit breaker compartments 20 and 22. Auxiliary compartment 24 may house various controls, relays, communication devices, indicators, and the like. First circuit breaker compartment 20 includes a first cover 28 and second circuit breaker compartment 22 includes a second cover 30. It should be understood that the number, location, and position of circuit breaker compartments and auxiliary compartments may vary.

In the exemplary embodiment shown, a circuit breaker 32 projects through second cover 30, as will be detailed more fully below. A third cover 34 is provided across auxiliary compartment 24. Cable portion 18 includes a line compartment 40 that may house bus bars 42 that provide power to electrical enclosure 2, neutral bars (not shown) that provide a neutral connection, and load connectors (also not shown) that provide a connection between circuit breaker 32 and an electrical load (also not shown).

In accordance with an exemplary embodiment, electrical enclosure 2 includes an exhaust duct 50 extending substantially vertically from about bottom wall 6 to top wall 4 and between circuit breaker portion 16 and cable portion 18. In accordance with an aspect of an exemplary embodiment, exhaust duct 50 extends substantially vertically through electrical enclosure 2 between circuit breaker portion 16 and bus bars 42. At this point, it should be understood that the phrase "substantially vertically" does not require that exhaust duct 50 extend perpendicularly relative to bottom wall 6. That is, exhaust duct 50 may extend at an angle relative to bottom wall 6. As will be detailed more fully below, exhaust duct 50 carries high pressurized gases that may develop during an arc fault event from electrical enclosure 2.

In further accordance with an exemplary embodiment, a first passage or opening 54 fluidically connects first circuit breaker compartment 20 and exhaust duct 50 and a second passage or opening 56 fluidically connects second circuit breaker compartment 22 and exhaust duct 50. A third opening or outlet 58 is arranged at top wall 4. Third opening 58 fluidically connects exhaust duct 50 with a plenum 60 arranged on top wall 4. In addition, third opening 58 fluidically connects line compartment 40 with plenum 60. Plenum 60 may fluidically link with additional electrical enclosures (not shown).

A wire mesh 62 extends across third opening 58. Wire mesh 62 allows exhaust gases to pass into plenum 60 and be exhausted through an exhaust opening 66. Plenum 60 directs exhaust gases through an external plenum (not shown) to avoid contact between exhaust gases and personnel that may be present near covers 28 and 30.

In further accordance with an exemplary embodiment, electrical enclosure 2 includes a first passage 70 extending between cable portion 18 and first circuit breaker compartment 20 through exhaust duct 50. A second passage 71 also extends between cable portion 18 and first circuit breaker compartment 20 through exhaust duct 50. First passage 70 may take the form of a first run-in passage 73 that provides a pathway for one or more conductors (not shown) electrically connecting bus bars 42 and a circuit breaker (also not shown) in first circuit breaker compartment 20. Second passage 71 may take the form of a first run-out passage 74 that provides a pathway for conductors (not shown) electrically connecting the circuit breaker 32 in first circuit breaker compartment 20 and load connectors in line compartment 40.

Similarly, a third passage 77 extends between cable portion 18 and second circuit breaker compartment 22 through exhaust duct 50. A fourth passage 78 also extends between cable portion 18 and second circuit breaker compartment 22 through exhaust duct 50. Third passage 77 may take the form of a second run-in passage 80 and fourth passage 78 may take the form of a second run-out passage 81. Second run-in passage 80 provides a pathway for one or more conductors 84 electrically connecting bus bars 42 and circuit breaker 32. Second run-out passage 81 provides a pathway for conductors 85 electrically connecting circuit breaker 32 and load connectors in line compartment 40. First, second, third, and fourth passages 70, 71, 77 and 78 are fluidically isolated from gases that may flow through exhaust duct 50.

In accordance with yet another aspect of an exemplary embodiment, electrical enclosure 2 includes a first ventilation opening 90 arranged in rear wall 8. A second ventilation opening 92 is arranged in rear wall 8 between first ventilation opening 90 and top wall 4. Of course, it should be understood, that the location of first and second ventilation openings 90 and 92 may vary. Ventilation openings 90 and 92 provide a pathway for venting gases from cable portion 18. That is, during normal operation, heat may be generated in cable portion 18, a cooling flow may pass through electrical enclosure 2 carrying the heat outward through ventilation openings 90 and 92.

A first closure 94 is provided at first ventilation opening 90 and a second closure 96 is provided at second ventilation opening 92. First closure 94 is shiftable between an open configuration demonstrated in FIG. 1, and a closed configuration, in which the first closure 94 is positioned to block the first ventilation opening 90. Likewise, second closure 96 is shiftable between an open configuration demonstrated in FIG. 1, and a closed configuration, in which the second closure 96 is positioned to block the second ventilation opening 92. First and second closures 94 and 96 are in a normally open position providing a ventilation pathway for line compartment 40. First and second closures 94 and 96 may shift to the closed configuration in response to a pressure wave in line compartment 40 that may be the result of an arc fault or other condition. In the closed configuration, the pressure wave is directed upwardly into plenum 60. Once the pressure wave has passed, or at least a peak value of the pressure wave has passed, first and second closures 94 and 96 re-open in response to gravity. That is, in accordance with an aspect of an exemplary embodiment, without the force of the pressure wave, first and second ventilation openings 90 and 92 are re-opened solely due to gravity acting on first and second closures 94 and 96 without any manual intervention.

Reference will now follow to FIGS. 2-6 in describing second cover 30 in accordance with yet another aspect of an exemplary embodiment. It should however be understood that first cover 28 may include similar structure. Second cover 30 includes an outer surface 157 and an inner surface 158. An opening 160 receptive of circuit breaker 32 is formed in second cover 30. While the second cover 30 is illustrated as pivotally and hingedly attached via hinge 31 to the enclosure 2, in other embodiments, the cover 30 may be attached using other mechanical attachment devices including, but not limited to, fasteners, screws, etc. Opening 160 includes a first edge portion 164, an opposing, second edge portion 165, a third edge portion 166 extending between first and second edge portions 164 and 165, and a fourth edge portion 167 extending between first and second edge portions 164 and 165 opposite third edge portion 166. A gasket 174 extends about opening 160 to provide a seal between ambient and second circuit breaker compartment 22.

Figure 2:
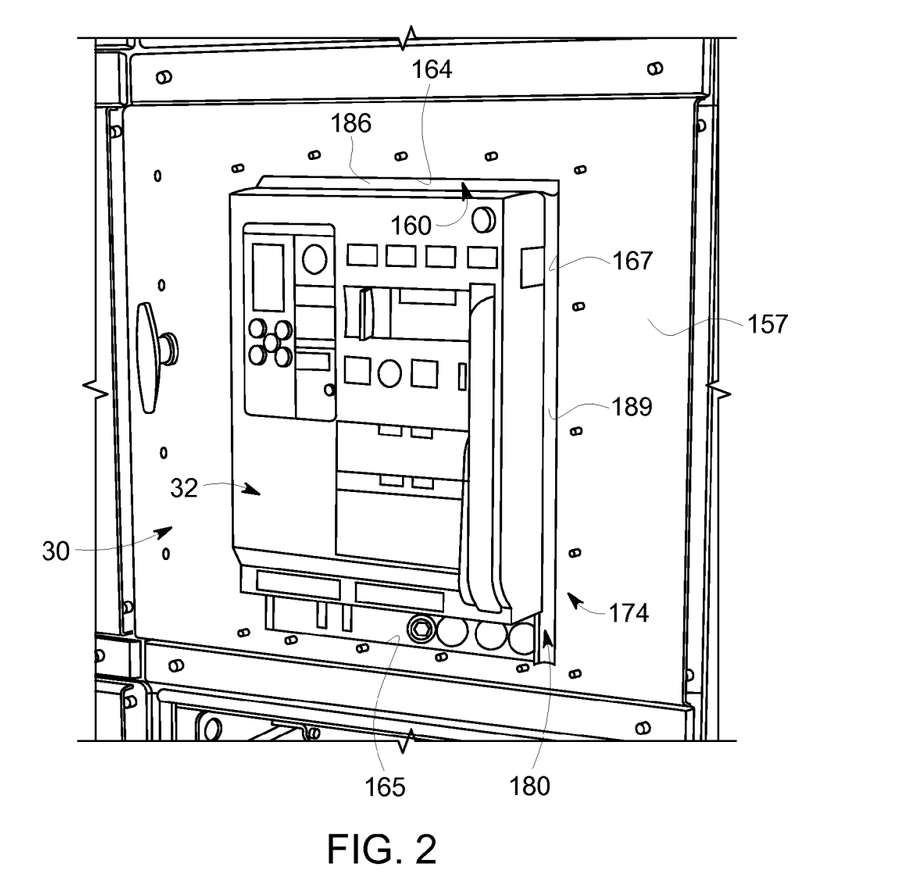
FIG. 2 depicts a cover having a gasket of the electrical enclosure of FIG. 1.
Figure 3:
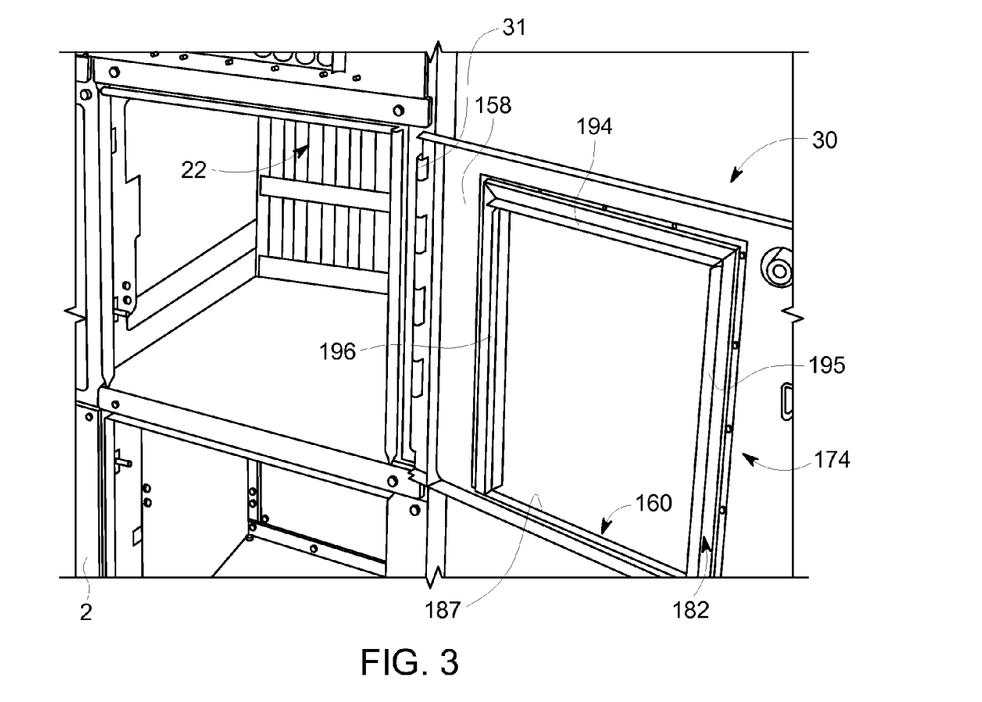
FIG. 3 depicts the cover of FIG. 2 in an open configuration.
Figure 5:
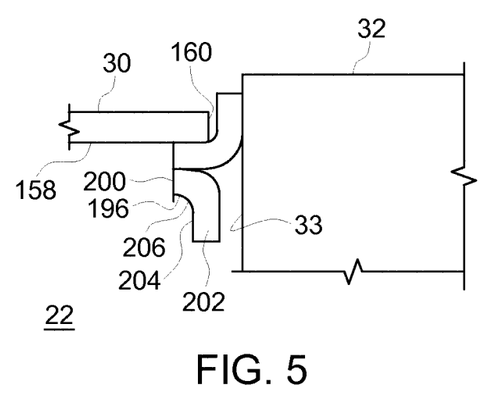
FIG. 5 depicts a schematic view of a portion of the gasket in a non-deployed configuration; and, FIG. 6 depicts a schematic view of a portion of the gasket in a deployed configuration.
Figure 6:
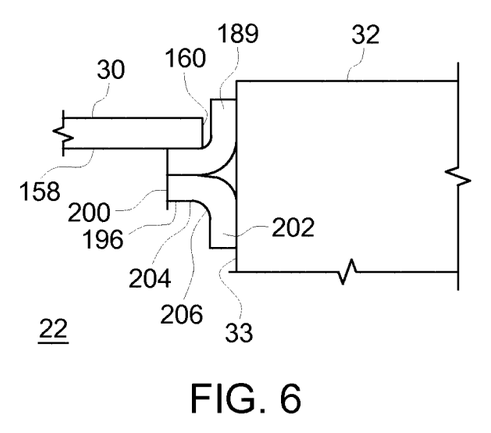

In accordance with an aspect of an exemplary embodiment, gasket 174 includes an outer seal assembly 180 and an inner seal assembly 182. Outer seal assembly 180 includes a first outer seal member 186, a second outer seal member 187, a third outer seal member 188, and a fourth outer seal member 189. First outer seal member 186 is secured to inner surface 158 along first edge portion 164. Second outer seal member 187 is secured to inner surface 158 along second edge portion 165. Third outer seal member 188 is secured to inner surface 158 along third edge portion 166, and fourth outer seal member 189 is secured to inner surface 158 along fourth edge portion 167. First, second, third, and fourth outer seal members 186-189 directly engage an outer surface (not separately labeled) of circuit breaker 32 when second cover 30 is in a closed configuration with respect to the circuit breaker 32, as shown in FIGS. 2, 5, and 6. In this manner, outer seal assembly 180 inhibits ingress of foreign objects to second circuit breaker compartment 22.

Inner seal assembly 182 is arranged to selectively engage the outer surface of circuit breaker 32. More specifically, inner seal assembly 182 includes a first inner seal member 194, a second inner seal member 195, and a third inner seal member 196. In accordance with an aspect of an exemplary embodiment first inner seal member 194 is mounted to inner surface 158 along first edge portion 164 through first outer seal member 186. Second inner seal member 195 is mounted to inner surface 158 along third edge portion 166 through third outer seal member 188, and third inner seal member 196 is mounted to inner surface 158 along fourth edge portion 167 through fourth outer seal member 189. In the exemplary embodiment shown, second edge portion 165 is devoid of an inner seal member in order to accommodate additional structure (not separately labeled) arranged below circuit breaker 32. Of course, it should be understood, that a fourth inner seal member could be added in other configurations.

In a normal, non-deployed configuration, first, second, and third inner seal members 194-196 are spaced from, and thereby disengaged from, the outer surface of circuit breaker 32. FIG. 5 illustrates an embodiment of third inner seal member 196 in the non-deployed configuration with respect to outer surface 33 of circuit breaker 32. In this manner, second cover 30 may freely transition between open and closed configurations with respect to the circuit breaker 32 without inner seal assembly 182 providing an impediment. In a deployed configuration, first, second, and third inner seal members 194-196 directly engage the outer surface of circuit breaker 32. FIG. 6 illustrates an embodiment of third inner seal member 196 in the deployed configuration with respect to outer surface 33 of circuit breaker 32. More specifically, inner seal members 194-196 are responsive to a pressure wave in second circuit breaker compartment 22 to flex outwardly to engage the outer surface of circuit breaker 32. In this manner, inner seal assembly 182 inhibits passage of gases, solids, and/or semi-solids such as molten metal passing from second circuit breaker compartment 22 during an arc fault condition.

Figure 4:
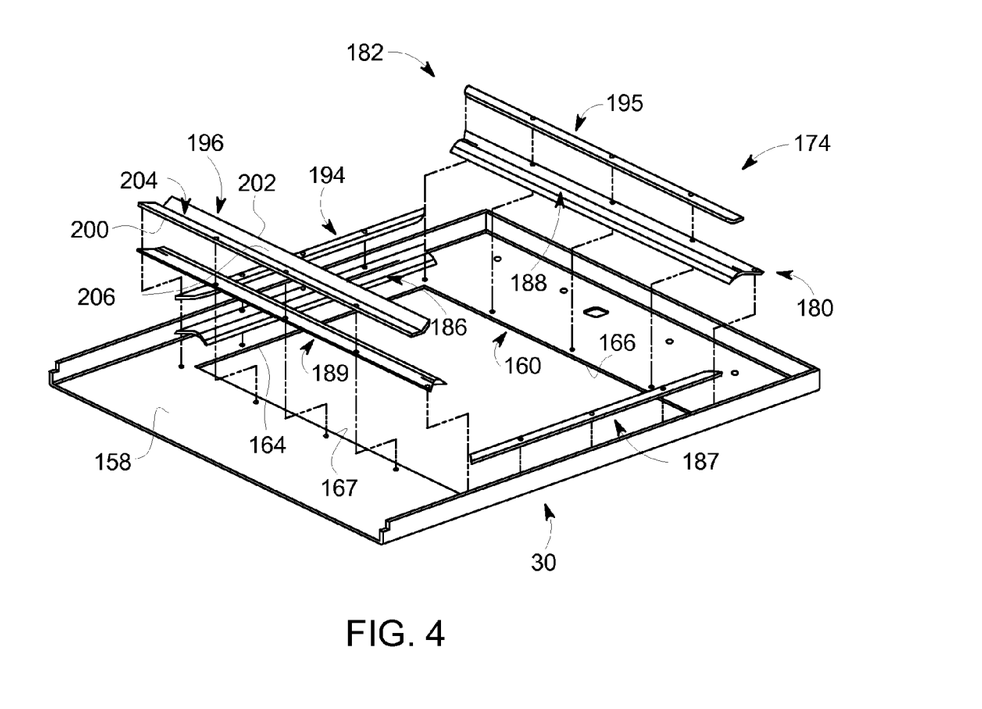
FIG. 4 depicts a partially exploded view of the cover and gasket of FIG. 2.

Reference will now follow to FIG. 4 in describing third inner seal member 196 with an understanding that first and second inner seal members 194 and 195 may include similar structure. Third inner seal member 196 includes a first, fixed end 200, and a second, cantilevered end 202. An intermediate portion 204 extends between first and second ends 200 and 202. First, fixed end 200 is secured to inner surface 158 through fourth outer seal member 189. In a biased condition, the second, cantilevered end 202 is spaced, and thereby disengaged, from the outer surface 33 of circuit breaker 32 in the non-deployed configuration of the inner seal assembly 182, as demonstrated in FIG. 5. In the deployed configuration of the inner seal assembly 182, second, cantilevered end 202 flexes, or deforms, against the biased condition and into engagement with the outer surface of circuit breaker 32 in response to a pressure wave in second circuit breaker compartment 22, as demonstrated by FIG. 6. In order to enhance responsiveness to the pressure wave, intermediate portion 204 includes a curvilinear surface 206. Curvilinear surface 206 defines a pressure wave receiving surface (not separately labeled) that cups the pressure wave causing second end 202 to flex outwardly into contact with the outer surface of circuit breaker 32 thereby inhibiting flow from second circuit breaker compartment 22 through the opening 160 to an ambient environment exterior of the electrical enclosure 2.

At this point, it should be understood that the exemplary embodiments describe systems that contain and direct gases and other debris that may be generated in an electrical enclosure due to, for example, an arc fault condition. More specifically, the exemplary embodiments direct gases that may form as a result of an arc fault condition along a predetermined path through the electrical enclosure. Various openings that could provide an outlet, such as covers and ventilation openings, are closed, and an exhaust path defined that guides gases upwardly and outwardly of the electrical enclosure. In this manner, the gases, and any debris that may be entrained within the gases, may be directed to a desired location avoiding contact with personnel that may be near the electrical enclosure during an arc fault event.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:
1. An electrical enclosure comprising:
at least one circuit breaker compartment;
a cover mounted to the electrical enclosure, the cover including an opening receptive of at least one circuit breaker; and
a gasket extended about at least a portion of the opening, the gasket including an inner seal assembly and an outer seal assembly, the outer seal assembly positioned to engage the at least one circuit breaker when the cover is in a closed position with respect to the at least one circuit breaker, and the inner seal assembly is movable between a non-deployed configuration and a deployed configuration;
wherein the inner seal assembly in the non-deployed configuration is spaced from the at least one circuit breaker in the closed position of the cover, and the inner seal assembly is responsive to a pressure wave in the at least one circuit breaker compartment to move from the non-deployed configuration to the deployed configura- tion to engage the at least one circuit breaker and substantially prevent out gassing through the opening in the cover.

2. The electrical enclosure according to claim 1, wherein the inner seal assembly includes at least one inner seal member having a cantilevered end projecting into the at least one circuit breaker compartment.

3. The electrical enclosure according to claim 2, wherein the at least one inner seal member further includes a curvilinear surface to define a pressure wave receiving surface responsive to the pressure wave.

4. The electrical enclosure according to claim 2, wherein the cover includes an inner surface arranged to face the at least one circuit breaker compartment, the at least one inner seal member further including a fixed end secured to the inner surface of the cover.

5. The electrical enclosure according to claim 1, wherein the opening includes a first edge portion, a second edge portion, a third edge portion extending between the first and second edge portions, and a fourth edge portion extending between the first and second edge portions spaced from the third edge portion, the inner seal assembly extending along at least one of the first, second, third, and fourth edge portions.

6. The electrical enclosure according to claim 5, wherein the inner seal assembly includes a first inner seal member extending along the first edge portion, a second inner seal member extending along the third edge portion, and a third inner seal member extending along the fourth edge portion.

7. The electrical enclosure according to claim 6, wherein the second edge portion is devoid of any portion of the inner seal assembly.

8. The electrical enclosure according to claim 7, wherein the second edge portion defines a bottom edge portion of the opening.

9. The electrical enclosure according to claim 1, wherein the cover includes an inner surface arranged to face the at least one circuit breaker compartment, the outer seal assembly disposed between the inner surface and the inner seal assembly.

10. An electrical enclosure comprising:
   at least one circuit breaker compartment;
   at least one circuit breaker having an outer surface positioned in the at least one circuit breaker compartment;
   a cover mounted to the electrical enclosure, the cover including an opening receptive of the at least one circuit breaker; and
   a gasket extended about at least a portion of the opening, the gasket including an inner seal assembly and an outer seal assembly, the outer seal assembly positioned to engage the at least one circuit breaker when the cover is in a closed position with respect to the at least one circuit breaker, and the inner seal assembly is movable between a non-deployed configuration and a deployed configuration;
   wherein the inner seal assembly in the non-deployed configuration is spaced from the at least one circuit breaker in the closed position of the cover, and the inner seal assembly is responsive to a pressure wave in the at least one circuit breaker compartment to move from the non-deployed configuration to the deployed configuration to engage the outer surface of the at least one circuit breaker and substantially prevent out gassing through the opening in the cover.

11. The electrical enclosure according to claim 10, wherein the inner seal assembly includes at least one inner seal member having a cantilevered end projecting into the at least one circuit breaker compartment.

12. The electrical enclosure according to claim 11, wherein the at least one inner seal member further includes a curvilinear surface to define a pressure wave receiving surface responsive to the pressure wave.

13. The electrical enclosure according to claim 11, wherein the cover includes an inner surface arranged to face the at least one circuit breaker compartment, the at least one inner seal member further including a fixed end secured to the inner surface of the cover.

14. The electrical enclosure according to claim 10, wherein the cover includes an inner surface arranged to face the at least one circuit breaker compartment, the outer seal assembly disposed between the inner surface and the inner seal assembly.

15. A method of sealing an electrical enclosure comprising:
   positioning a cover to cover a circuit breaker compartment of the electrical enclosure;
   passing a portion of a circuit breaker arranged in the circuit breaker compartment through an opening formed in the cover;
   sealing about an outer surface of the circuit breaker with an outer seal assembly extending about the opening; and
   selectively sealing about the outer surface of the circuit breaker with an inner seal assembly responsive to a pressure wave in the circuit breaker compartment;
   wherein the inner seal assembly is spaced from the circuit breaker in absence of the pressure wave.

16. The method of claim 15, wherein the selectively sealing about the outer surface includes capturing a portion of the pressure wave with a curvilinear surface of the inner seal assembly.

17. The method of claim 15, wherein the inner seal assembly includes first, second, and third inner seal members, and
   wherein selectively sealing about the outer surface includes positioning the first inner seal member along a first edge portion of the opening, the second inner seal member along a third edge portion of the opening and the third inner seal member along a fourth edge portion of the opening.

18. The method of claim 15, wherein the sealing about an outer surface of the circuit breaker with the outer seal assembly includes inhibiting a flow of one of a gas and a particle into the circuit breaker compartment from the opening.

19. The method of claim 15, wherein the selectively sealing about the outer surface includes inhibiting gases developed from an arc fault event passing through the opening from the circuit breaker compartment.

20. The method of claim 15, wherein the selectively sealing about the outer surface includes inhibiting one of solid particles and molten material developed from an arc fault event passing through the opening from the circuit breaker compartment.

* * * * *